United States Patent
Kuhn

(10) Patent No.: US 9,484,846 B2
(45) Date of Patent: Nov. 1, 2016

(54) DRIVE SYSTEM WITH COMBINED ACTUATION OF BRAKE AND ENCODER

(71) Applicant: Siemens Aktiengesellschaft, München (DE)

(72) Inventor: Andreas Kuhn, Chemnitz (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 0 days.

(21) Appl. No.: 14/489,011

(22) Filed: Sep. 17, 2014

(65) Prior Publication Data

US 2015/0077024 A1  Mar. 19, 2015

(30) Foreign Application Priority Data

Sep. 18, 2013  (EP) .................................... 13184970

(51) Int. Cl.
*H02P 3/04* (2006.01)
*H02P 29/00* (2016.01)
*H05K 7/14* (2006.01)

(52) U.S. Cl.
CPC .............. *H02P 3/04* (2013.01); *H02P 29/00* (2013.01); *H05K 7/1471* (2013.01)

(58) Field of Classification Search
CPC ............ H02P 3/04; H02P 29/00; H02P 3/00; H02P 15/00; H02P 4/00; H05K 7/1471
See application file for complete search history.

(56) References Cited

U.S. PATENT DOCUMENTS

| | | | | |
|---|---|---|---|---|
| 5,327,055 A * | 7/1994 | Danielson | ................. | H02P 3/04 318/366 |
| 5,402,052 A * | 3/1995 | Cheng | ............... | G11B 11/10508 318/685 |
| 5,914,583 A * | 6/1999 | Botterbrodt | ......... | B41F 13/0045 318/370 |
| 7,080,825 B1 * | 7/2006 | George | .................... | B66D 3/18 254/267 |
| 7,898,196 B2 * | 3/2011 | Horikoshi | ................. | H02P 3/04 318/273 |
| 8,907,599 B2 * | 12/2014 | Koral | ........................ | H02P 3/16 188/24.14 |
| 2003/0223738 A1 * | 12/2003 | Hughes | .................. | B66C 13/24 388/800 |
| 2004/0222764 A1 * | 11/2004 | Miura | .................... | H02K 11/33 318/638 |
| 2004/0239185 A1 | 12/2004 | Kollmann | | |
| 2006/0071622 A1 * | 4/2006 | Townsend | .............. | B25J 9/1612 318/400.31 |
| 2010/0277224 A1 * | 11/2010 | Jockel | ................ | G01D 5/24452 327/530 |
| 2012/0235606 A1 * | 9/2012 | Takeuchi | ............. | H02K 7/1023 318/371 |
| 2014/0096996 A1 * | 4/2014 | Sidlyarevich | ............ | H01B 7/04 174/115 |

FOREIGN PATENT DOCUMENTS

| | | |
|---|---|---|
| DE | 199 08 045 A1 | 9/2000 |
| DE | 103 57 806 A1 | 12/2004 |
| DE | 10 2011 100 361 A1 | 11/2012 |

* cited by examiner

*Primary Examiner* — Shawki S Ismail
*Assistant Examiner* — Muhammad S Islam
(74) *Attorney, Agent, or Firm* — Henry M. Feiereisen LLC

(57) ABSTRACT

A drive system includes a line assembly configured to connect a power converter to an electric motor which has a brake and an encoder. The line assembly has at least two power lines and only two brake lines exclusively to provide a data transfer between the power converter and the electric motor and to transfer energy to the encoder. The power converter applies a first supply voltage of a first polarity and a second supply voltage of a second polarity opposite to the first polarity to the brake lines for supplying the brake and the encoder. The electric motor supplies the encoder with the respective supply voltage independently of its polarity and the brake with the respective supply voltage depending on its polarity.

12 Claims, 2 Drawing Sheets

DRIVE SYSTEM WITH COMBINED ACTUATION OF BRAKE AND ENCODER

CROSS-REFERENCES TO RELATED APPLICATIONS

This application claims the priority of European Patent Application, Serial No. 13184970, filed Sep. 18, 2014, pursuant to 35 U.S.C. 119(a)-(d), the disclosure of which is incorporated herein by reference in its entirety as if fully set forth herein.

BACKGROUND OF THE INVENTION

The present invention relates to a drive system, and more particularly to a drive system having an electric motor with a brake and encoder.

The following discussion of related art is provided to assist the reader in understanding the advantages of the invention, and is not to be construed as an admission that this related art is prior art to this invention.

A drive system of this type is suitable for a production machine, for example a milling machine, a turning machine, or the like, but also for robots, conveyors etc. This type of drive system is also referred to as servo drive and typically have an electric motor with a brake, and a power converter which is connected to the electric motor by way of a plurality of cables.

In electric servo drives, transducers or encoders having a digital interface in the motor are normally used to date for sensing the position of the electric motor. These encoders are connected via an encoder line which contains the voltage supply conductors and the conductors required for transfer of data.

Besides data lines and voltage supply lines for the encoder, so-called power lines are provided for transfer of electrical energy to the electric motor. In addition, control lines are provided for the brake which is normally operated by a DC voltage (for example 24 V DC). For the most part, the lines between converter and electric motor are grouped in two cables which run in parallel and which require space in the cable conduit and the cable carrier. This is disadvantageous.

It is known to use only one cable between power converter and electric motor, wherein the electric motor has a brake and an encoder. With the introduction of the "HIPERFACE DSL" encoder interface by the Sick-Stegmann company, voltage supply, and data communication with the encoder can be realized via only two twisted-pair lines. Such a line can be very thin and integrated together with the power lines into a single cable. While a user needs to connect only a single cable (generally referred to as line assembly), which includes the encoder lines, between power converter and motor, there is still a need on the electric motor for a special connector which accommodates the additional contacts for the two communication cores. Such connectors are commercially available in connector sizes of up to 1.5. Beyond that, there is however no corresponding connection technology.

It would therefore be desirable and advantageous to provide an improved drive system which obviates prior art shortcomings and has a simplified connection technology.

SUMMARY OF THE INVENTION

According to one aspect of the present invention, a drive system includes a power converter, an electric motor having a brake and an encoder, and a line assembly configured to connect the power converter to the electric motor, the line assembly having at least two power lines and two brake lines exclusively to provide a data transfer between the power converter and the electric motor and to transfer energy to the encoder, with the power converter being configured to apply a first supply voltage of a first polarity and a second supply voltage of a second polarity opposite to the first polarity to the brake lines for supplying the brake and the encoder, and with the electric motor being configured to supply the encoder with a respective one of the first and second supply voltages independently of their polarity and to supply the brake with a respective one of the first and second supply voltages depending on their polarity.

The present invention resolves prior art problems by providing a power converter which is able to make available supply voltages of differing polarity. The electric motor for its parts is then able to continuously supply the encoder irrespective of the polarity and to utilize the polarity of the supply voltage in order to specifically actuate the brake, i.e. to apply and to release the brake. With this technology it is then possible to implement the transfer of energy and data by means of the power lines and exclusively two additional brake lines According to another advantageous feature of the present invention, the power converter and the electric motor can be configured to transfer the data over the brake lines. Although, data could conceivably be transferred over the power lines for the motor, transferring the data over the brake lines has the advantage that the encoder and the brake are supplied with DC voltage, from which high-frequency data signals can be separated with minimum effort. Alternating currents in the power lines would tend to influence the alternating signals involved in data transfer.

According to another advantageous feature of the present invention, the data transfer can take place over the brake lines at a frequency above 10 kHz. Currently preferred is a frequency above 1 MHz, e.g data transfer at 33 MHz. This ensures a sufficiently great spectral distance from the DC voltage supply to brake and encoder, but also a sufficient distance from the supply frequency of conventional single-phase or three-phase systems for the motor supply. Data can therefore be transferred or retrieved in a reliable manner.

According to another advantageous feature of the present invention, the power converter may include a switchable bridge to generate the first and second supply voltages from a DC voltage. The provision of such a switchable bridge enables, in a simple manner, to generate a supply voltage of a first polarity and a reverse second polarity from a DC voltage.

According to another advantageous feature of the present invention, a diode can be provided to connect the brake, arranged in or on the electric motor, to the brake lines. In this manner, the brake can be actuated in polarity-related fashion with minimum effort.

According to another advantageous feature of the present invention, a bridge rectifier can be provided to connect the encoder to the brake lines. Such a bridge rectifier ensures a supply at the output which is independent of the polarity at the input.

According to another advantageous feature of the present invention, the brake lines can be shielded separately with respect to the power lines. This ensures that a data transfer is realized through the brake lines unimpaired.

According to another advantageous feature of the present invention, a total shielding can be provided to encase all the power and brake lines of the line assembly. This has the advantage that interference effects are not introduced from outside into the power lines and the brake lines, nor are interference effects emitted by them to the outside.

According to another advantageous feature of the present invention, the electric motor may be configured as a three-phase motor, with the line assembly having four power lines. Conventional three-phase motors having brake and encoder can thereby also benefit from the simple connection principle.

According to another advantageous feature of the present invention, a driver module can be coupled to the brake lines for data transfer in both the power converter and the electric motor. When the driver module involves for example an Ethernet transceiver, a classic Ethernet communication can be realized between the power converter and the motor.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
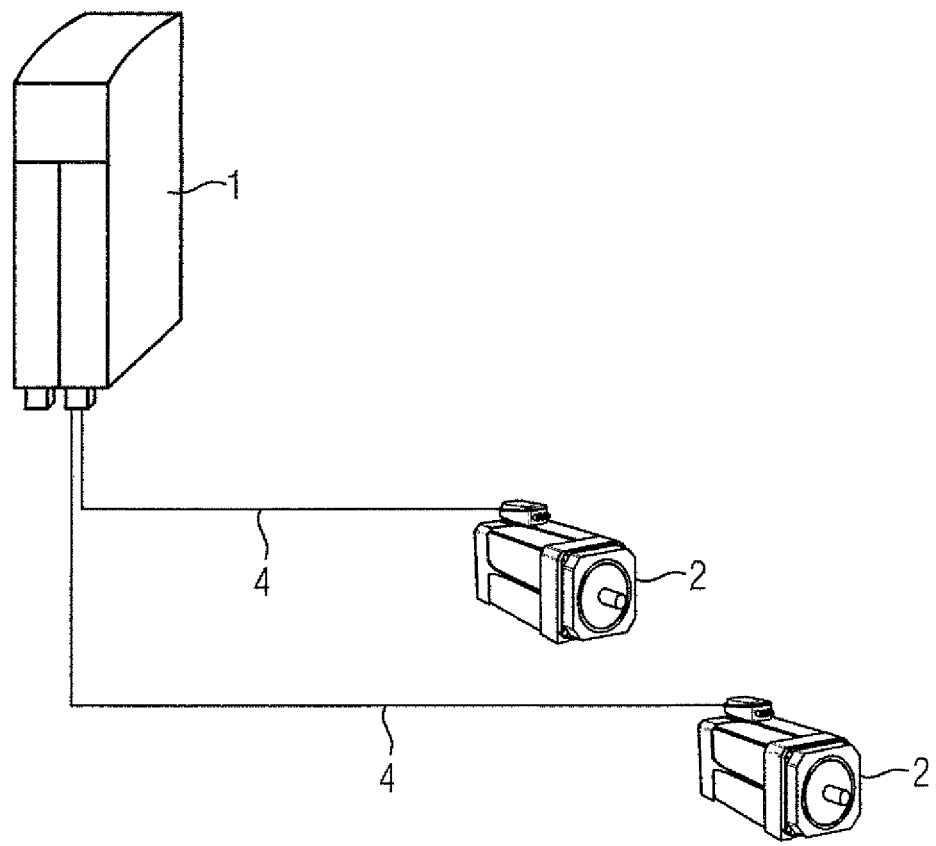
FIG. 1 is a simplified basic illustration of a drive system in accordance with the present invention.

Throughout all the figures, same or corresponding elements may generally be indicated by same reference numerals. These depicted embodiments are to be understood as illustrative of the invention and not as limiting in any way. It should also be understood that the figures are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

Turning now to the drawing, and in particular to FIG. 1, there is shown a simplified basic illustration of a drive system in accordance with the present invention which is suitable for example as a drive for a milling machine. The drive system has a power converter 1 and here two electric motors 2. The power converter 1 can therefore actuate one electric motor 2 or a plurality of electric motors 2.

Each of the electric motors 2 has a brake which is not illustrated and an encoder which is not illustrated. Both or only one of these can be integrated into the housing of the electric motor. In principle however both can also be mounted on the exterior of the housing of the electric motor 2. The brake serves to rapidly brake the shaft or the rotor of the motor. Such a brake is typically operated electromagnetically. In this situation it is advantageous for safety reasons if the brake is applied in the deenergized state and releases when energized.

In addition, each of the two electric motors 2 has an encoder. By using such an encoder 3 (cf. FIG. 2) it is possible to sense the rotational speed, the angle of rotation, the rotational position or the like of the rotor or the shaft of the electric motor 2 and to make corresponding information available externally.

Each of the electric motors 2 is connected by a single cable 4 (generally referred to as line assembly) to the power converter 1. Such a cable 4 transfers
a) the drive energy for the electric motor 2,
b) the energy for supplying the brake,
c) the energy for supplying encoder 3 and
d) data between the power converter 1 and the encoder 3.

The use of a single cable therefore ensures that the energy required in each case and the data obtained are transferred between the power converter 1 and the electric motor 2 including the integrated or connected brake and encoder.

Figure 2:
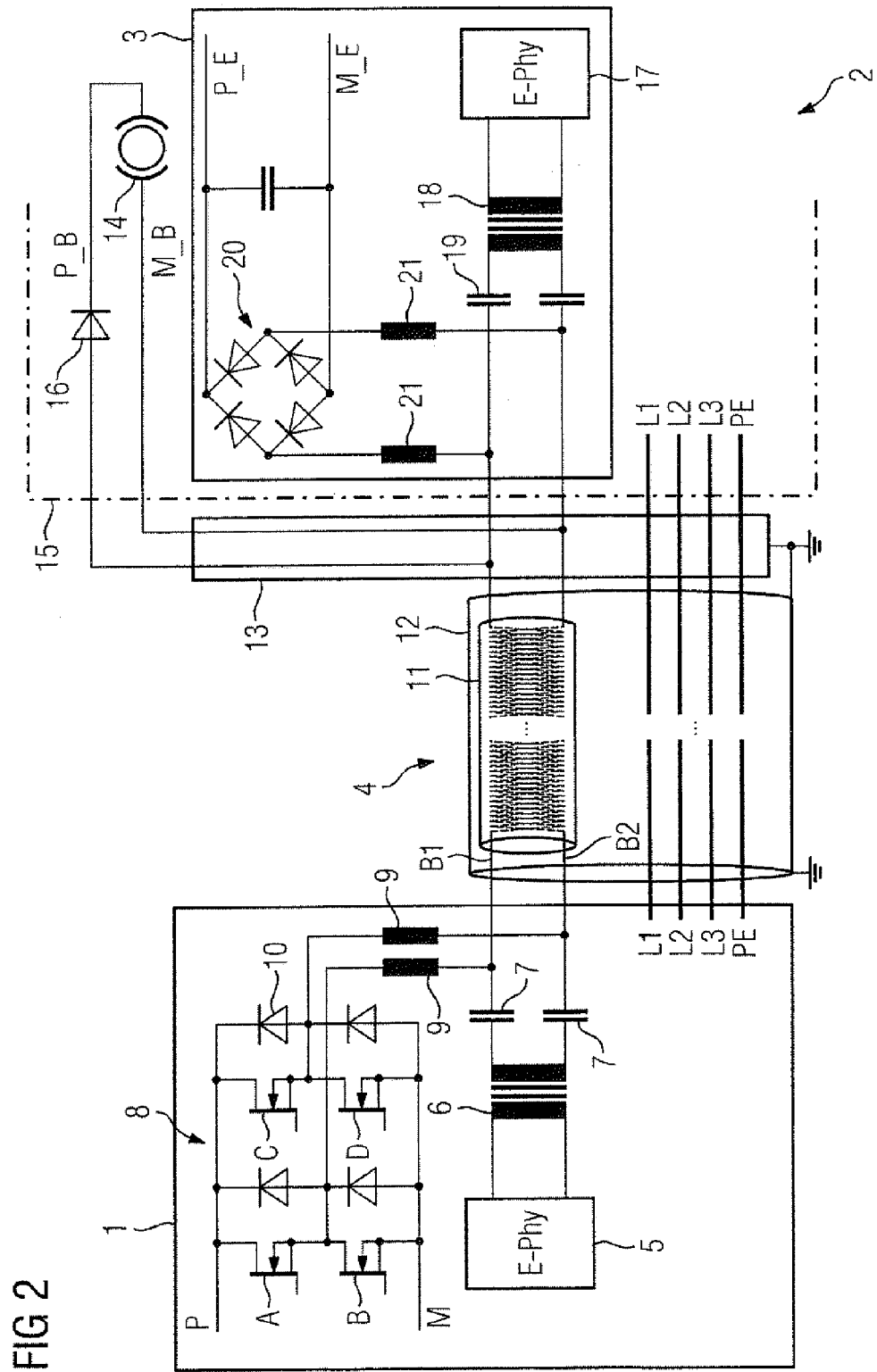
FIG. 2 is a block diagram of the drive system from FIG. 1.

FIG. 2 shows a block diagram of an electric motor 2 connected by means of a cable 4 to the converter 1. The power converter 1 is symbolized by a rectangle which in practice represents the housing thereof. The power electronics which generates the three-phase current for driving the electric motor 2 is not illustrated here for the sake of clarity. Representing the power output, merely the three phase conductors L1, L2 and L3 and also the neutral conductor PE (also referred to below as "power lines") are drawn in at the output of the power converter 1. For the sake of simplicity, said phase and neutral conductors are drawn in continuously from the power converter 1 continuing through the cable 4 to the electric motor 2. Each of said power lines L1, L2, L3 and PE has a corresponding connection in the form of a terminal or a socket or plug connector in or on the power converter.

The power converter 1 furthermore has a driver module 5 as a transceiver for communication with the encoder 3. In abstract terms this is concerned with the physical layer of an Ethernet connection. Two communication lines of the driver module 5 are connected to the primary side of a transformer 6 provided for galvanic decoupling in the power converter 1. On the secondary side the communication lines are routed by way of capacitors 7 to the brake lines B1 and B2 of the cable 4. This can take place for example by way of a connector system which is not illustrated.

In addition the power converter 1 has a switchable bridge 8 which is fed on the input side by a DC voltage, symbolized by the positive pole P and the negative pole M. Said DC voltage serves to supply the motor-side encoder and the motor-side brake. The outputs of the bridge 8 are connected by way of series inductances 9 to the brake lines B1 and B2. The bridge 8 is designed as a full bridge and has four branches, in each of which is arranged a switch or transistor, IGBT or the like A, B, C and D. A diode 10 is connected in parallel with each of said switches.

The cable 4 is connected for example by way of a connector which is not illustrated to the power converter 1. In addition to the power lines L1, L2, L3 and PE, the only other lines situated in the cable 4 are the brake lines B1 and B2. The brake lines B1 and B2 are encased in the cable 4 by a separate shield 11. They are thereby shielded electromagnetically with respect to the power lines. In addition, the cable 4 here has a total shielding 12 which encases all the lines in the cable 4. The entire cable 4 is thereby electromagnetically shielded. The shields 11 and 12 are only optionally present.

If only a single-phase electric motor is to be actuated or supplied by way of the cable 4, only two power lines need to be provided. In this case the cable 4 would be four-core (two power lines and two brake lines). For each further phase an additional power line is to be provided.

In order to supply the three-phase electric motor 2 the six-core cable 4 culminates on the motor side in a corresponding six-pole connector 13. The latter takes the lines of the cable 4 into the interior of the motor, if the brake 14 and the encoder 3 are arranged inside the housing of the electric motor 2. If the brake 14 and the encoder 3 are arranged outside the motor housing, the brake lines B1 and B2 can also be taken on outside the motor housing. In the example shown in FIG. 2, part of the motor housing 15 is indicated by a dashed line. Windings in which the power lines L1, L2 and L3 or PE culminate are not illustrated for the sake of clarity.

In the example shown in FIG. 2, the encoder 3 and the brake 14 are situated inside the motor housing 15. The brake 14 by means of which the rotor of the electric motor 2 or the shaft thereof can be braked is connected by way of a diode 16 to the two brake lines B1 and B2. Current flow is there only possible in one direction through the brake 14. A positive pole P_B and a negative pole M_B thus result for actuation of the brake.

The encoder 3 is likewise connected to the brake lines B1 and B2. It likewise has a driver module 17 as a transceiver for communication with the power converter 1. From its perspective the driver module 17 is likewise connected on the primary side to a transformer 18 for galvanic decoupling. On the secondary side thereof the brake lines B1 and B2 are connected by way of capacitors 19.

The power supply to the encoder 3 takes place by way of the brake lines B1 and B2. To this end the input of a full bridge 20 is connected by way of series inductances 21 to the brake lines B1 and B2. A positive pole P_E and a negative pole M_E for the voltage supply to the encoder 3 result at the output of the full bridge 20. Both poles are optionally connected to a capacitor 22 for the purpose of DC voltage smoothing.

The operation of the drive system will be explained in detail in the following, where three operating states are of significance:

I) the electric motor is switched off and the brake is applied,
II) the electric motor is running and the brake is released and
III) the electric motor is running (at least temporarily) and the brake is applied.

During state I) in which the electric motor is switched off and the brake 14 is likewise not energized the latter is applied mechanically, which means that the rotor of the electric motor 2 is at a standstill. The switches A, B, C and D of the bridge 8 of the power converter 1 are in this case not energized, i.e. A=B=C=D=0. Consequently no voltage is present at the poles P_B and M_B and the brake is applied.

In state II) when the motor is running, the brake 14 is released. To this end the switches A and D are energized but not the switches B and C, i.e. A=D=1 and B=C=0. Accordingly the positive potential P is applied by way of the switch A to the upper brake line B1 in FIG. 2 while the negative potential M is applied by way of the switch D to the lower brake line B2. Current consequently flows by way of the diode 16 and the positive pole to the brake 14 and from there by way of the negative pole M_B back to the lower brake line B2. The brake 14 is therefore energized and thereby released.

In state III) the motor is to be braked. To this end the switches B and C are set to high potential and the switches A and D to low potential, i.e. A=D=0 and B=C=1. Accordingly the positive supply potential is applied by way of the switch C to the lower brake line B2 and the negative supply potential by way of the switch D to the upper brake line B1. The diode 16 prevents a current from flowing from the positive lower brake line B2 by way of the brake 14 to the negative upper brake line B1. The brake 14 is therefore not energized and is thus applied mechanically.

Throughout the entire period of operation the encoder 3 is to be supplied with current by way of the brake lines B1 and B2. In state I) the electric motor is not in operation and therefore no voltage is present on the brake lines B1 and B2, as a result of which the encoder 3 is also not supplied with current. In state II) however, when the upper brake line B1 is positive, current flows by way of the series inductance 21 to the full bridge rectifier 20. There it flows through the upper left diode to the positive pole P_E of the encoder supply. The current flows back by way of the negative pole M_E, the lower right diode and the other series inductance 21 into the lower brake line B2. The encoder 3 is therefore supplied with current while the motor 2 is running.

In state III) when the motor is, or is being, braked the encoder 3 is likewise to be supplied with current. This is ensured by the fact that current flows from the lower, now positive, brake line 2 by way of the right upper diode of the full bridge rectifier 20 to the positive pole P_E. The current flows back by way of the negative pole M_E and the left lower diode of the full bridge rectifier 20 into the now positive upper brake line B1. The current flow also takes place here by way of the series inductances 21. The current supply to the encoder 3 is therefore also guaranteed in this state III).

According to the invention the transfer of the encoder data and of the encoder supply is also carried out on the two cores for actuating the (DC) brake. The corresponding connecting conductors are for the most part already present in the motor line and also the corresponding contacts are already provided in the connector assemblies commonly used today, which means that no departures from the standard are required here. In addition, the connection technology variants to be supplied are reduced because connections for encoder line and power line with/without brake line are no longer required, but only connections for power line and brake line because the corresponding cables can also be used for drive systems without a brake.

In an advantageous manner the functions of (reliable) brake actuation, encoder voltage supply and communication interface can therefore be implemented by way of a single line pair (brake lines) in one cable. It is possible in this situation to exploit the fact that the actuation of the brake and the supply of the encoder takes place with DC voltage of for example 24 V while the data transfer takes place free of a direct component for example at approx. 33 MHz or more. The corresponding alternating signal lies at such a spectral distance from the DC voltage that it can be separated from the DC voltage with a minimum requirement in terms of circuitry.

The supply to the encoder can take place such that the encoder is already supplied with voltage before the brake is released, while the brake is being released and after the brake has been released. The brake on the other hand is reliably released or applied again in certain operating situations, which is made possible by the reversal of the supply voltage.

The encoder preferably contains a bridge rectifier which ensures the correct polarity of the supply voltage in each case. The brake however is conveniently decoupled by means of a diode which enables the current flow and thereby the release of the brake only in the case of one of the polarities of the supply voltage. The three possible operating situations, as indicated above, are thereby covered: encoder and brake off/encoder on, brake off/encoder and brake on.

In an advantageous embodiment this type of actuation on the power converter side can also be combined with a monitoring facility which enables a check on the individual transistor shutdown branches in the switchable bridge 8 and thereby enables reliable brake actuation in accordance with various safety requirements.

A twisted core pair is preferably used for the digital transfer. RS485 based and also shielded single pair Ethernet based transfer protocols can be employed. In an advantageous form of application it would therefore be possible here to transfer HIPERFACE DSL over the brake lines.

In a further advantageous embodiment, real-time Ethernet protocols in particular with two-wire technology can be used.

While the invention has been illustrated and described in connection with currently preferred embodiments shown and described in detail, it is not intended to be limited to the details shown since various modifications and structural changes may be made without departing in any way from the spirit and scope of the present invention. The embodiments were chosen and described in order to explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein:

1. A drive system, comprising:
   a power converter;
   an electric motor including a brake and an encoder; and
   a line assembly configured to connect the power converter to the electric motor, said line assembly having at least two power lines and two brake lines exclusively to provide a data transfer between the power converter and the electric motor and to transfer energy to the encoder,
   said power converter being configured to apply a first supply voltage of a first polarity and a second supply voltage of a second polarity opposite to the first polarity to the brake lines for supplying the brake and the encoder,
   said electric motor being configured to supply the encoder with a respective one of the first and second supply voltages independently of their polarity and to supply the brake with a respective one of the first and second supply voltages depending on their polarity.

2. The drive system of claim 1 integrated in a production machine.

3. The drive system of claim 1, wherein the power converter and the electric motor are configured to transfer the data over the brake lines.

4. The drive system of claim 3, wherein the data transfer takes place over the brake lines at a frequency above 10 kHz.

5. The drive system of claim 4, wherein the frequency is above 1 MHz.

6. The drive system of claim 1, wherein the power converter has a switchable bridge configured to generate the first and second supply voltages from a DC voltage.

7. The drive system of claim 1, further comprising a diode configured to connect the brake, arranged in or on the electric motor, to the brake lines.

8. The drive system of claim 1, further comprising a bridge rectifier configured to connect the encoder to the brake lines.

9. The drive system of claim 1, wherein the brake lines are shielded separately with respect to the power lines.

10. The drive system of claim 1, further comprising a total shielding configured to encase all the power and brake lines of the line assembly.

11. The drive system of claim 1, wherein the electric motor is a three-phase motor and the line assembly has four of said power lines.

12. The drive system of claim 1, further comprising a driver module coupled to the brake lines for data transfer in both the power converter and the electric motor.

* * * * *